United States Patent
Manack et al.

(10) Patent No.: US 12,009,319 B2
(45) Date of Patent: Jun. 11, 2024

(54) INTEGRATED CIRCUIT WITH METAL STOP RING OUTSIDE THE SCRIBE SEAL

(71) Applicant: Texas Instruments Incorporated, Dallas, TX (US)

(72) Inventors: Christopher Daniel Manack, Flower Mound, TX (US); Qiao Chen, Flower Mound, TX (US); Michael Todd Wyant, Dallas, TX (US); Matthew John Sherbin, Dallas, TX (US); Patrick Francis Thompson, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 439 days.

(21) Appl. No.: 16/737,237

(22) Filed: Jan. 8, 2020

(65) Prior Publication Data

US 2021/0210440 A1    Jul. 8, 2021

(51) Int. Cl.
*H01L 23/58* (2006.01)
*H01L 23/528* (2006.01)
*H01L 23/532* (2006.01)

(52) U.S. Cl.
CPC .......... *H01L 23/585* (2013.01); *H01L 23/528* (2013.01); *H01L 23/53209* (2013.01)

(58) Field of Classification Search
CPC ..... H01L 21/82; H01L 23/562; H01L 23/528; H01L 23/53209; H01L 23/585
See application file for complete search history.

(56) References Cited

U.S. PATENT DOCUMENTS

| | | | | |
|---|---|---|---|---|
| 7,453,128 | B2 * | 11/2008 | Tsutsue | H01L 23/564 257/409 |
| 8,492,805 | B2 * | 7/2013 | Akiyama | H01L 31/18 257/291 |
| 9,966,297 | B2 * | 5/2018 | Morimoto | H01L 21/78 |
| 2006/0267154 | A1 | 11/2006 | Pitts et al. | |

* cited by examiner

*Primary Examiner* — Phat X Cao
*Assistant Examiner* — Diana C Vieira
(74) *Attorney, Agent, or Firm* — Ronald O. Neerings; Frank D. Cimino

(57) ABSTRACT

An integrated circuit (IC) die includes a substrate with circuitry configured for at least one function including metal interconnect levels thereon including a top metal interconnect level and a bottom metal interconnect level, with a passivation layer on the top metal interconnect level. A scribe street is around a periphery of the IC die, the scribe street including a scribe seal utilizing at least two of the plurality of metal interconnect levels, an inner metal meander stop ring including at least the top metal interconnect level located outside the scribe seal, wherein the scribe seal and the inner metal meander stop ring are separated by a first separation gap. An outer metal meander stop ring including at least the top metal interconnect level is located outside the inner metal stop ring, wherein the outer stop ring and the inner stop ring are separated by a second separation gap.

19 Claims, 8 Drawing Sheets

INTEGRATED CIRCUIT WITH METAL STOP RING OUTSIDE THE SCRIBE SEAL

FIELD

This Disclosure relates to laser-based wafer dicing of semiconductor wafers, more specifically to scribe seal arrangements for semiconductor die on a wafer that is laser-diced.

BACKGROUND

Semiconductor die are typically manufactured by dicing a semiconductor substrate generally referred to as being a 'wafer' that is typically at least 6 inches (about 150 mm) in diameter, such as 8 inches (about 200 mm) in diameter, or 12 inches (about 300 mm) in diameter, that comprises a plurality of semiconductor die of a predetermined die size, into a plurality of singulated dice. When dicing a wafer, an adhesive dicing tape is generally attached on a back side surface of the wafer to prevent the wafer from falling apart, and then the wafer is generally cut from the front side using a mechanical saw to singulate the semiconductor die.

Mechanical dicing saws provide die separations of generally about 40 μm, so that the die separations called scribe streets between the semiconductor die are made wide enough for such cuts. The scribe streets may include metal containing test structures (e.g., drop-ins). During dicing, the dicing tape attached to the back side surface of the wafer is slightly cut into its surface, but not entirely cut through, and the semiconductor die remain held on the dicing tape. After singulation, a wafer expander is used to provide tape expansion of the dicing tape that spreads apart the singulated die to better enable a die picker to pick up the semiconductor die one-by-one from the dicing tape, which are then transferred to a subsequent assembly step, such as a die bonding step, using a die attach material for the semiconductor die attachment.

Laser saws for wafer dicing are known as alternative to mechanical dicing saws. Laser saws enable die separations of much less in width as compared to mechanical saws, typically scribe streets only about 6 μm wide for laser beams having a diameter of 2 μm to 3 μm. Ablation lasers are known for laser dicing which ablate away substrate material, where the focal point of the laser beam is at the surface of the wafer and substrate material is removed by vaporization during the laser cutting process.

The sawing process in the case of laser dicing causes chipping and cracking within the scribe streets (also known as dicing streets). In order to prevent or reduce the propagation of such cracks, it is known to design scribe streets to ensure that the remaining material surrounds the active region of the chip that includes circuitry with a scribe seal structure which defines an outer edge of the scribe street adjacent to the active region, also called a primary die area. A scribe seal comprises multiple layers of the metal interconnect stack and inter-layer dielectric (ILD) material with filled metal vias referred to herein as metal plugs between the metal interconnect layers applied laterally adjacent to the scribe street for a distance greater than the saw kerf. When the wafer is sawn in the scribe street, the scribe seal remains around the outer edge of each individual semiconductor chip.

"Stealth" laser dicers are also known that utilize a subsurface wafer radiation treatment that forms embedded cracks in the scribe street of the wafer using a pulsed laser beam at a wavelength that transmits into the thickness of the wafer. For silicon wafers, near-infrared (near IR) lasers are used by stealth laser dicers because of the undesired silicon absorption of shorter wavelengths (e.g., visible light) by silicon. The embedded cracks resulting from stealth laser dicing is known to generally extend in a non-linear fashion in what is termed a meandering pattern (or a shifting pattern) which results from uneven lateral shifting of the laser cut lines along crack faults at the top side substrate, such as silicon, and metal layers. Due to circuit reliability concerns, if the meandering pattern is determined to reach the scribe seal anywhere along its perimeter, because nothing blocks the meandering of the laser damage from reaching the primary die area inside the scribe seal, the semiconductor die is generally rejected. What is termed a fill metal array comprising an overlapping two-dimensional (2D) array of metal squares is known to be positioned outside the scribe seal to control the meandering of the laser damage.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize the conventional array of overlapping fill metal squares for controlling meandering (or shifting) of the crystal damage from a laser cut during laser singulation does not prevent meandering from reaching the scribe seal which as described above causes circuit yield loss. The meandering can sometimes terminate in the fill metal, or other times reach the scribe seal and cause a yield loss.

Disclosed aspects include an integrated circuit (IC) die including a substrate having a semiconductor surface layer with circuitry configured for at least one function including a plurality of metal interconnect levels thereon comprising a top metal interconnect level and a bottom metal interconnect level, with a passivation dielectric layer on the top metal interconnect level. A scribe seal utilizing at least two of the plurality of metal interconnect levels is around a periphery of the IC die that defines an edge of a primary die area. The scribe seal generally comprises alternating metal interconnect layers coupled vertically (in the thickness direction of the die) through the ILD layers with metal plugs.

One disclosed aspect comprises an IC with two metal meander stop rings. An inner metal meander stop ring comprising at least the top metal interconnect level is located outside the scribe seal, wherein the scribe seal and the inner metal meander stop ring are separated by a first separation gap. An outer metal meander stop ring comprising at least the top metal interconnect level is located outside the inner metal stop ring, wherein the outer stop ring and the inner stop ring are separated by a second separation gap.

Another disclosed aspect comprises an IC having only a single metal meander stop ring. In this aspect the metal meander stop consists of only the top metal interconnect level, or only the top metal interconnect level and the metal interconnect level immediately below the top metal interconnect level.

BRIEF DESCRIPTION OF THE DRAWINGS

Reference will now be made to the accompanying drawings, which are not necessarily drawn to scale, wherein.

DETAILED DESCRIPTION

Figure 1A:
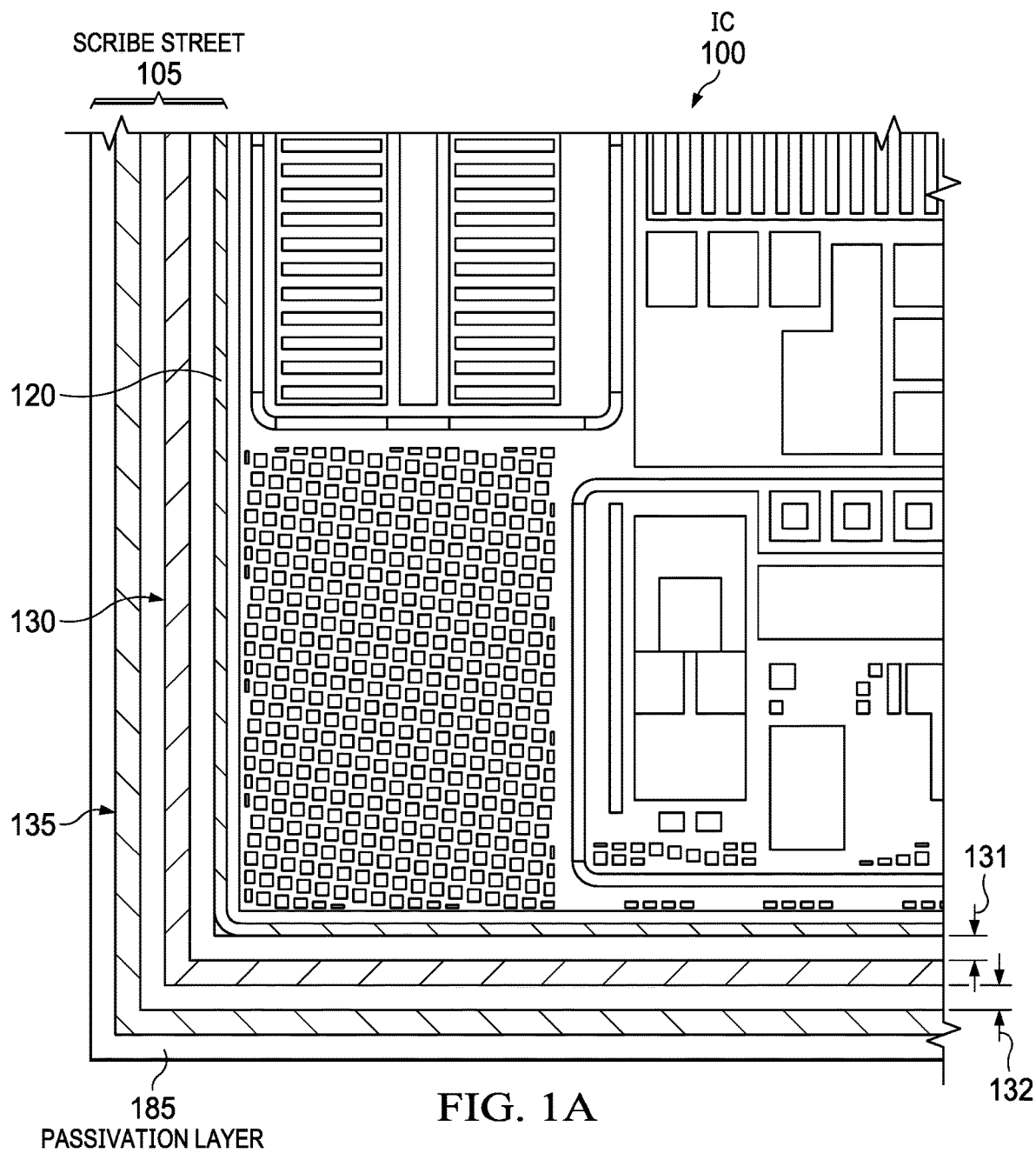
FIG. 1A shows a top perspective view depiction of an example IC die having a scribe seal along with a continuous inner meander stop ring and a continuous outer meander stop ring, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A shows a top perspective view depiction of an example IC die 100 having a scribe street 105 that comprises a scribe seal 120, along with an inner meander stop ring 130 and an outer meander stop ring 135 that are both continuous encircling structures that encircle the entire IC die 100. The scribe seal 120 includes at least two of the plurality of metal interconnect levels, but as described above generally includes all metal interconnect layers coupled together by metal plugs through ILD. The inner and outer metal meandering stop rings 130, 135 outside of the scribe seal 120 includes circuitry formed on a substrate (see substrate 110 in FIG. 2) having a semiconductor surface layer, with the circuitry including transistors and other circuit elements configured for at least one function including a plurality of metal interconnect levels thereon comprising a top metal interconnect level and a bottom metal interconnect level, with a passivation layer 185 comprising a dielectric material on the top metal interconnect layer.

The passivation layer 185 is shown being see-through when over inner and outer meander stop rings 130 and 135 to enable revealing the top metal interconnect layer of the inner and outer metal meander stop rings 130 and 135. As used herein, a "ring" means an continuous encircling structure with a shape that includes for example being circular or substantially circular, elliptical, rectangular, or square shaped, or disclosed ring can also comprise a plurality of segments with gaps between the segments (see FIG. 1B described below) that collectively define a shape that includes for example being circular or substantially circular, elliptical, rectangular, or square.

The scribe seal 120 and the inner metal meander stop ring 130 are separated by a first separation gap 131. The inner metal meander stop ring 130 and the outer metal meander stop ring 135 are separated by a second separation gap 132, where the inner and outer metal meander stop rings both comprise continuous encircling rings. The inner metal meander stop ring 130 and the outer metal stop ring 135 are both generally 1 to 3 µm wide, such as being 2 µm wide. The first separation gap 131 and the second separation gap 132 are also both generally 1 to 3 µm wide, such as being 2 µm wide.

As described above during stealth laser dicing the laser beam may be approximately 2 to 3 µm wide, where the laser beam is generally incident on the back side of the wafer. The laser beam is focused (depthwise) internally near the center of the scribe street of a wafer that generally comprises silicon. Stealth laser dicing does not remove any material within the scribe streets. Stealth laser dicing processing only internally cracks the semiconductor material that generally comprises silicon, and a die separation is created using this technique by the stretching of a dicing tape under the top side of the wafer after the stealth laser dicing processing.

Figure 1B:
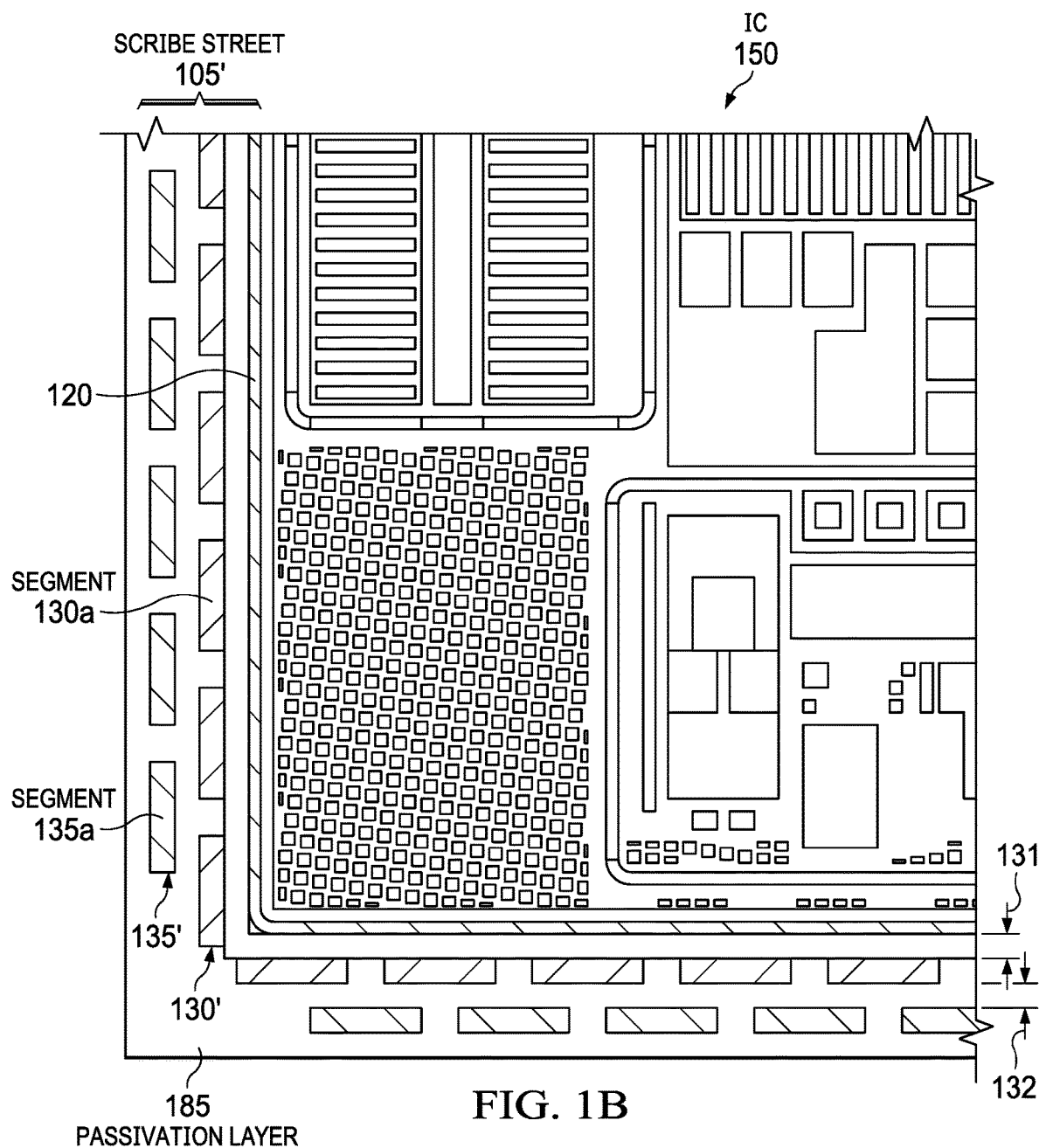
FIG. 1B shows a top perspective view depiction of an example IC die having a scribe seal along with a non-continuous inner meander stop ring and non-continuous outer meander stop ring separated by a gap, where the respective metal meander stop rings each comprise a plurality of segments that from ring-to-ring viewed from a direction perpendicular to the length direction of the segments are offset in position from one another and overlap one another, according to an example aspect.

FIG. 1B shows a top perspective view depiction of an example IC die 150 having a scribe street 105' that comprises a scribe seal 120, along with a non-continuous inner meander stop ring 130' and outer meander stop ring 135' that each comprise a plurality of segments that from ring-to-ring viewed in a direction perpendicular to the length direction of the segments are offset in position from one another, and overlap one another. The inner metal meander stop ring 130' comprises a plurality of first segments shown is 130a and the outer metal meander stop ring 135' comprises a plurality of second segments 135a.

The scribe seal 120 and the inner metal meander stop ring 130' are separated by a first separation gap 131. The inner metal meander stop ring 130' and the outer metal meander stop ring 135' are separated by a second separation gap 132. The first plurality of segments 130a are positioned over (overlapping) the gaps between the second plurality of segments 135a, and the second plurality of segments 135a are positioned over gaps between the first plurality of segments 130a. As used herein a "segment" has a length of at least 2 times its width, that therefore geometrically distinguishes over conventional fill metal squares.

Figure 2:
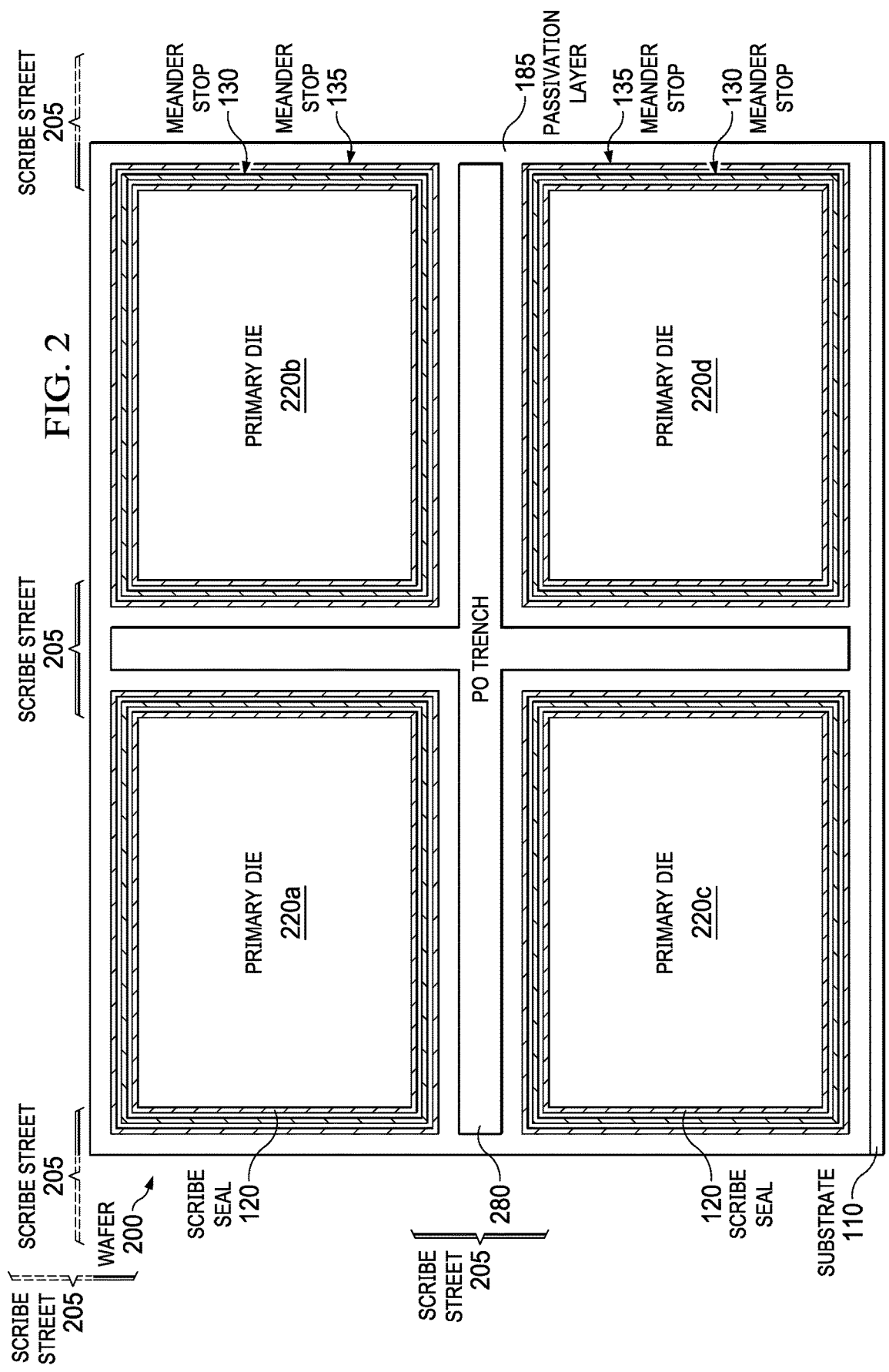
FIG. 2 is a depiction of a portion of a wafer that has a scribe street which includes a continuous inner metal meander stop ring and outer metal meander stop ring, having a passivation layer trench near the center of the scribe street, according to an example aspect.

FIG. 2 is a depiction of a portion of a wafer 200 comprising a substrate 110 showing 4 IC die 220a, 220b, 220c, and 220d, shown as being "primary die" with a wafer 200 comprises a scribe street 205 between the IC die. The scribe street 205 shown including a continuous inner metal meander stop ring 130 and a continuous outer metal meander stop ring 135. There is a passivation layer trench 280 shown as a "PO trench" near the center of the scribe street 205.

Figure 3A:
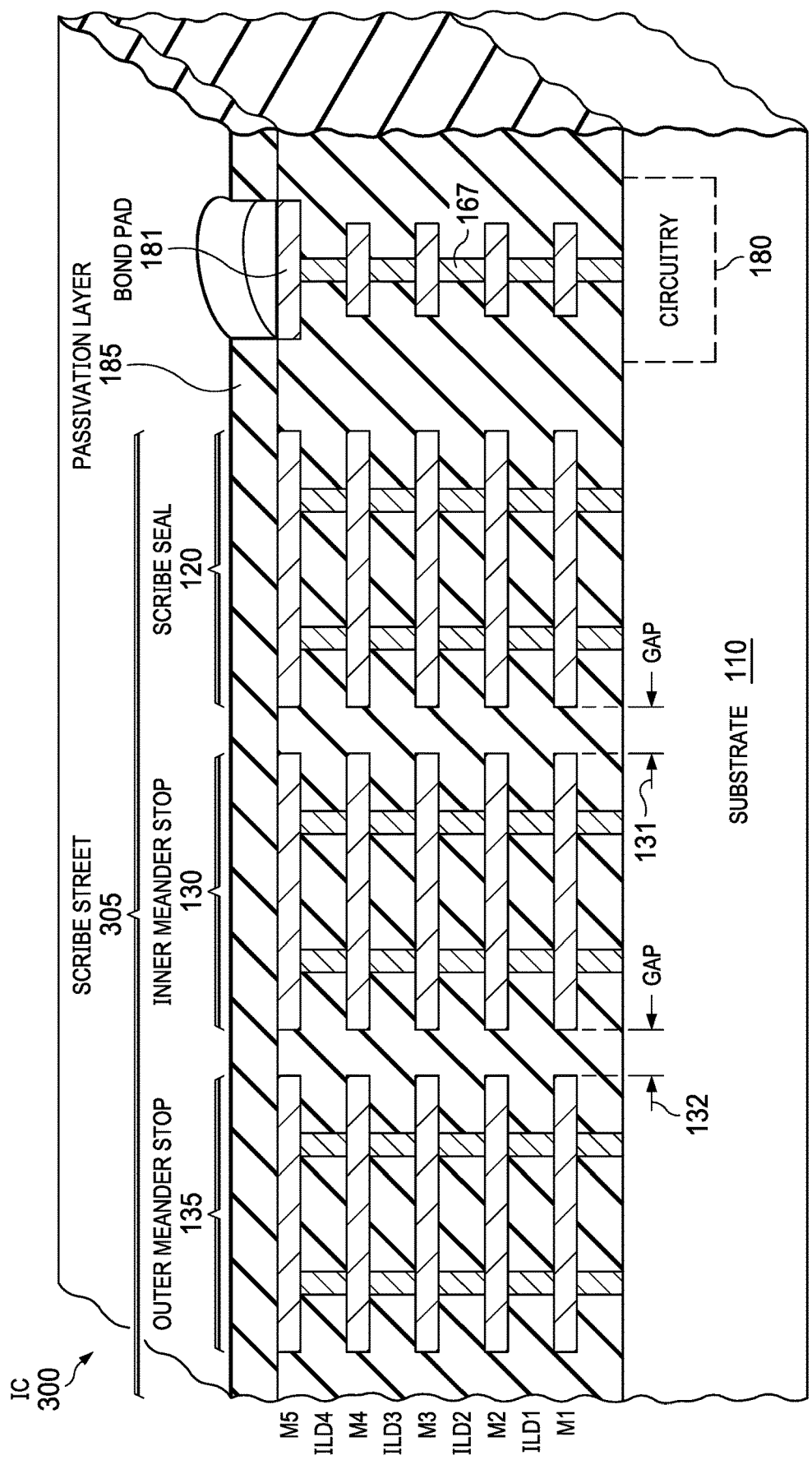
FIG. 3A shows a cross-sectional view of an IC having a scribe street including a scribe seal, and an inner metal meander stop ring and outer metal meander stop ring that each comprise a plurality of metal interconnect levels connected by metal plugs, according to an example aspect.

FIG. 3A shows a simplified cross-sectional view of an IC 300 comprising a substrate 110 having a scribe street 305 including a scribe seal 120, and an inner metal meander stop ring 130 and outer metal meander stop ring 135 that each comprise a plurality of metal interconnect levels. The metal interconnect levels are shown as metal 1 (M1) to metal 5 (M5), where M1 is the bottom metal layer and M5 is the top metal layer. The adjacent metal interconnect levels are coupled to one another by metal plugs 167 that are through the thickness of ILD layers shown as ILD1, ILD2, ILD3, and ILD4. Circuitry 180 is shown formed in the substrate 110 that has nodes coupled to bond pads with a single bond pad shown as bond pad 181 provided by the M5 layer.

The passivation layer 185 also known as a passivation overcoat (PO) that is on the top side surface of the IC 300, with contact points for electrically contacting nodes on the IC 300 being bond pads 181 exposed as required for electrical contact with the outside world. As before, there is a separation gap 131 provided between the scribe seal 120 and the inner metal meander stop ring 130 and a separation gap 132 between the inner metal meander stop ring 130 and the outer metal meander stop ring 135, which run substantially parallel to one another. The separation gaps 131, 132 are both generally on the order of about 2 to 3 µm wide.

Figure 3B:
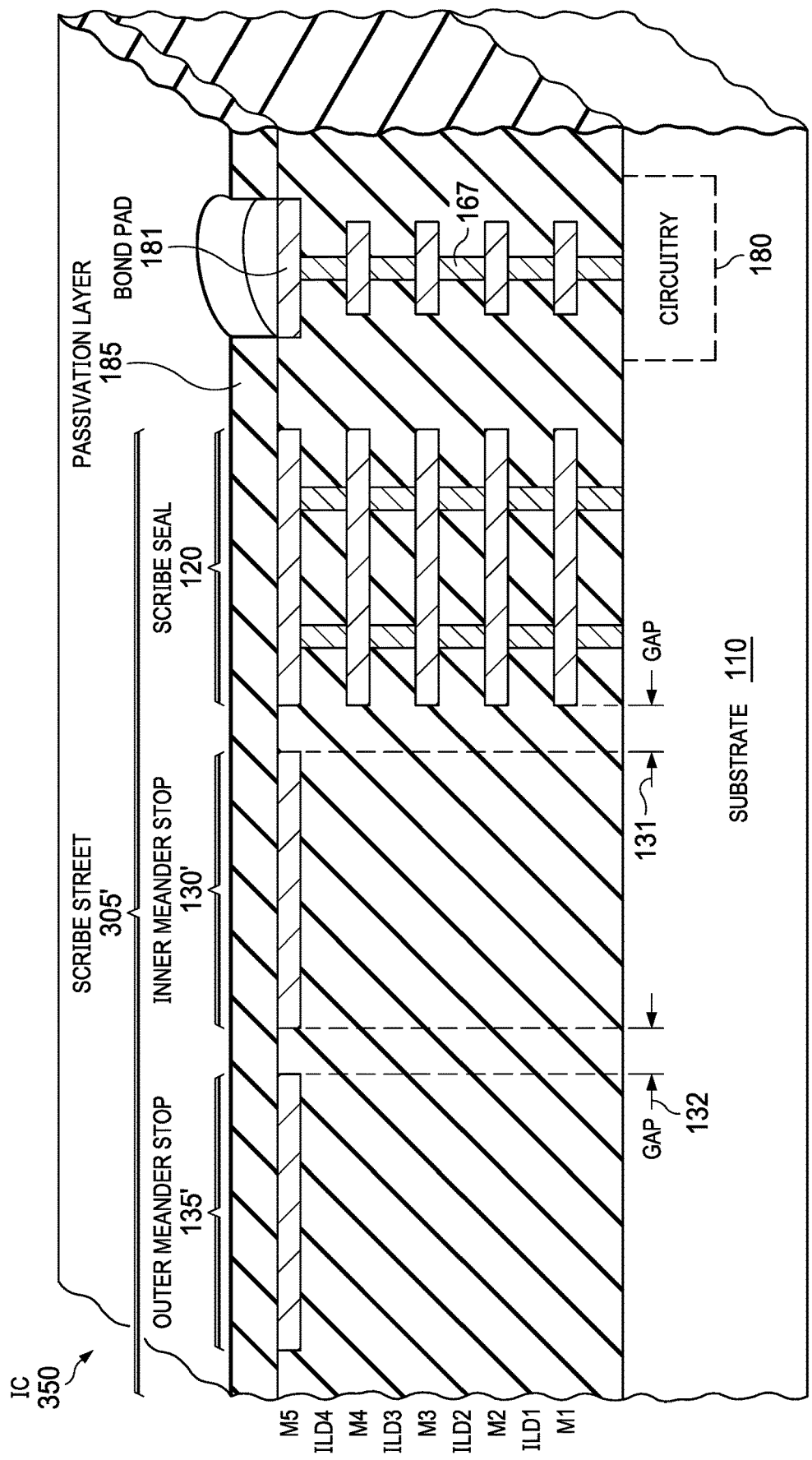
FIG. 3B shows a cross-sectional view of an IC having a scribe street including a scribe seal that comprises a plurality of metal interconnect levels connected by metal plugs, and an inner metal meander stop ring and an outer metal meander stop ring that each consist of only the top metal interconnect level, according to an example aspect.

FIG. 3B shows a simplified cross-sectional view of an IC 350 having a scribe street 305' including a scribe seal 120 that comprises a plurality of metal interconnect levels connected by metal plugs 167 through the ILD layers. The inner metal meander stop ring 130' and an outer metal meander stop ring 135 both each consist of only the top metal interconnect level shown as M5.

Figure 3C:
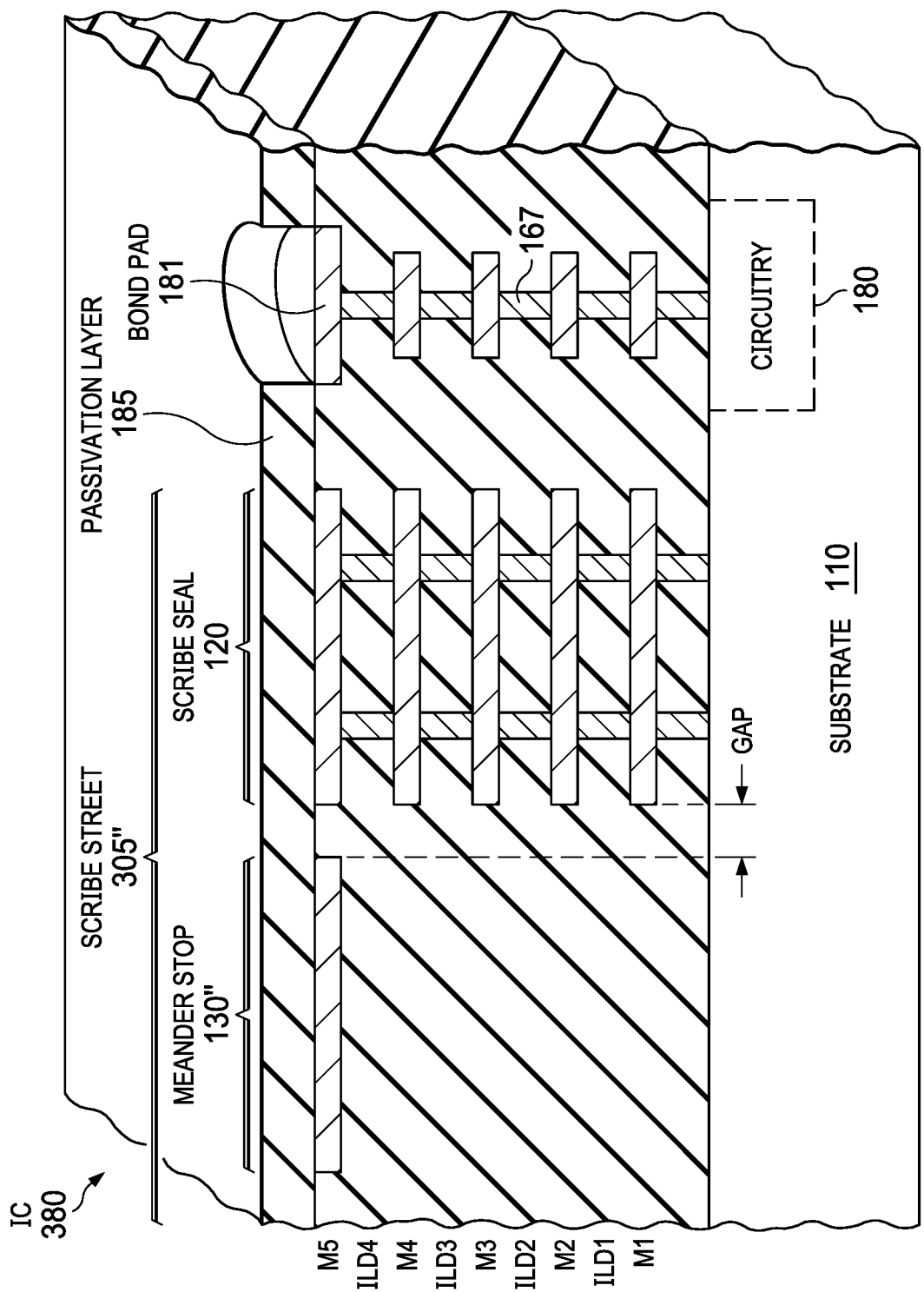
FIG. 3C shows a simplified cross-sectional view of an IC having a scribe street including a scribe seal that comprises a plurality of metal interconnect levels connected by metal plugs, with a single meander stop ring that consists of only the top metal interconnect level shown as M5, according to an example aspect.

FIG. 3C shows a simplified cross-sectional view of an IC 380 having a scribe street 305" including a scribe seal 120 that comprises a plurality of metal interconnect levels connected by metal plugs 167, with a single meander stop ring 130" that consists of only the top metal interconnect level shown as M5. IC 380 reflects the recognition that there is generally no need for a metal meander stop ring to include a full metal stack (meaning all the metal interconnect levels) to perform its intended function which as described above is different from the function of a scribe seal. Traditional scribe seals are configured as rings and comprise all metal layers to stop mechanical stress from creating cracks into the metal associated with the active circuitry (active metal) of the IC die and the area under the active metal of the IC die during mechanical dicing.

However, scribe seal structures are also in place to stop 'chip outs' into this same area. This is why conventional scribe seal structures encompass all the metal interconnect layers. In the case of stealth laser dicing associated with disclosed aspects, it is recognized there is no risk of chip out, so that there is no need to include every metal interconnect level as with the scribe seal structure. In the case of stealth laser dicing the cracks in the crystal propagate to the surface of the wafer where it then can meander and/or cause the passivation dielectric to peel into the die area. Thus, using the top metal only (or the top metal interconnect layer and no more than one metal interconnect layer directly under the top metal interconnect layer) instead of all the metal interconnect layer prevents the crack line from entering the primary die area. Stealth laser dicing is recognized to not carry a risk of mechanical cracks under the metal interconnect in the primary die area, so there is no need for a disclosed meander stop to include these additional layers of metal interconnect.

Figure 4:
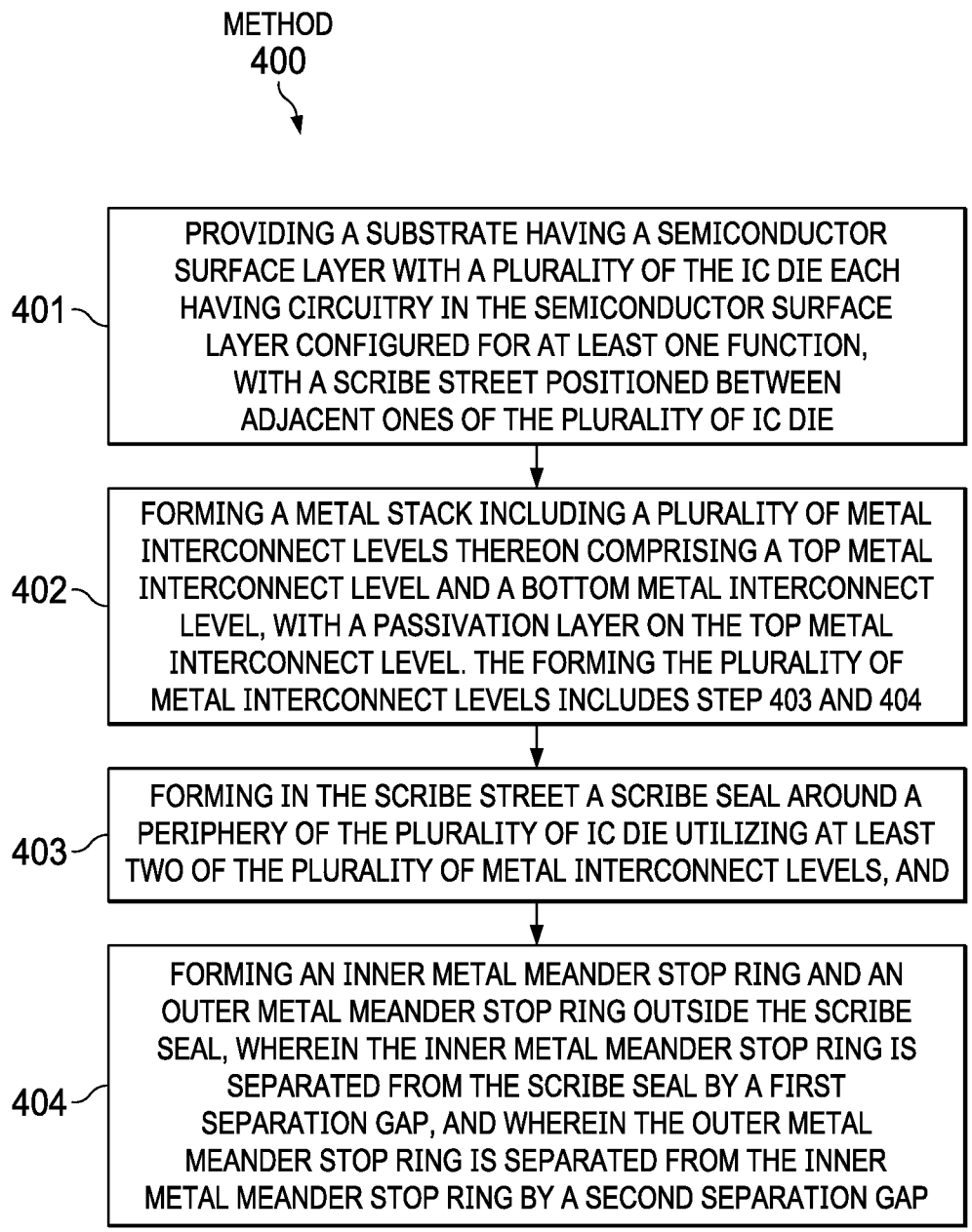
FIG. 4 is a flow chart that shows steps in an example method for fabricating IC die having an inner metal meander stop ring and an outer metal meander stop ring outside the scribe seal, according to an example aspect.

FIG. 4 is a flow chart that shows steps in an example method 400 for fabricating IC die having an inner metal meander stop ring and an outer metal meander stop ring outside the scribe seal, according to an example aspect. Step 401 comprises providing a substrate having a semiconductor surface layer with a plurality of the IC die each having circuitry in the semiconductor surface layer configured for at least one function, with a scribe street positioned between adjacent ones of the plurality of IC die. Step 402 comprises forming a metal stack including a plurality of metal interconnect levels thereon comprising a top metal interconnect level and a bottom metal interconnect level, with a passivation layer on the top metal interconnect level. The forming the plurality of metal interconnect levels includes step 403 comprising forming in the scribe street a scribe seal around a periphery of the plurality of IC die utilizing at least two of the plurality of metal interconnect levels, and step 404 comprising forming an inner metal meander stop ring and an outer metal meander stop ring outside the scribe seal, wherein the inner metal meander stop ring is separated from the scribe seal by a first separation gap, and wherein the outer metal meander stop ring is separated from the inner metal meander stop ring by a second separation gap.

The method 400 can further comprise etching the passivation layer in a portion of the scribe street between adjacent ones of the outer metal meander stop rings to provide a trench in the passivation layer. The method can also further comprise stealth laser dicing focused depthwise in the scribe street to generate embedded crystal damage in the scribe street.

Figure 5:
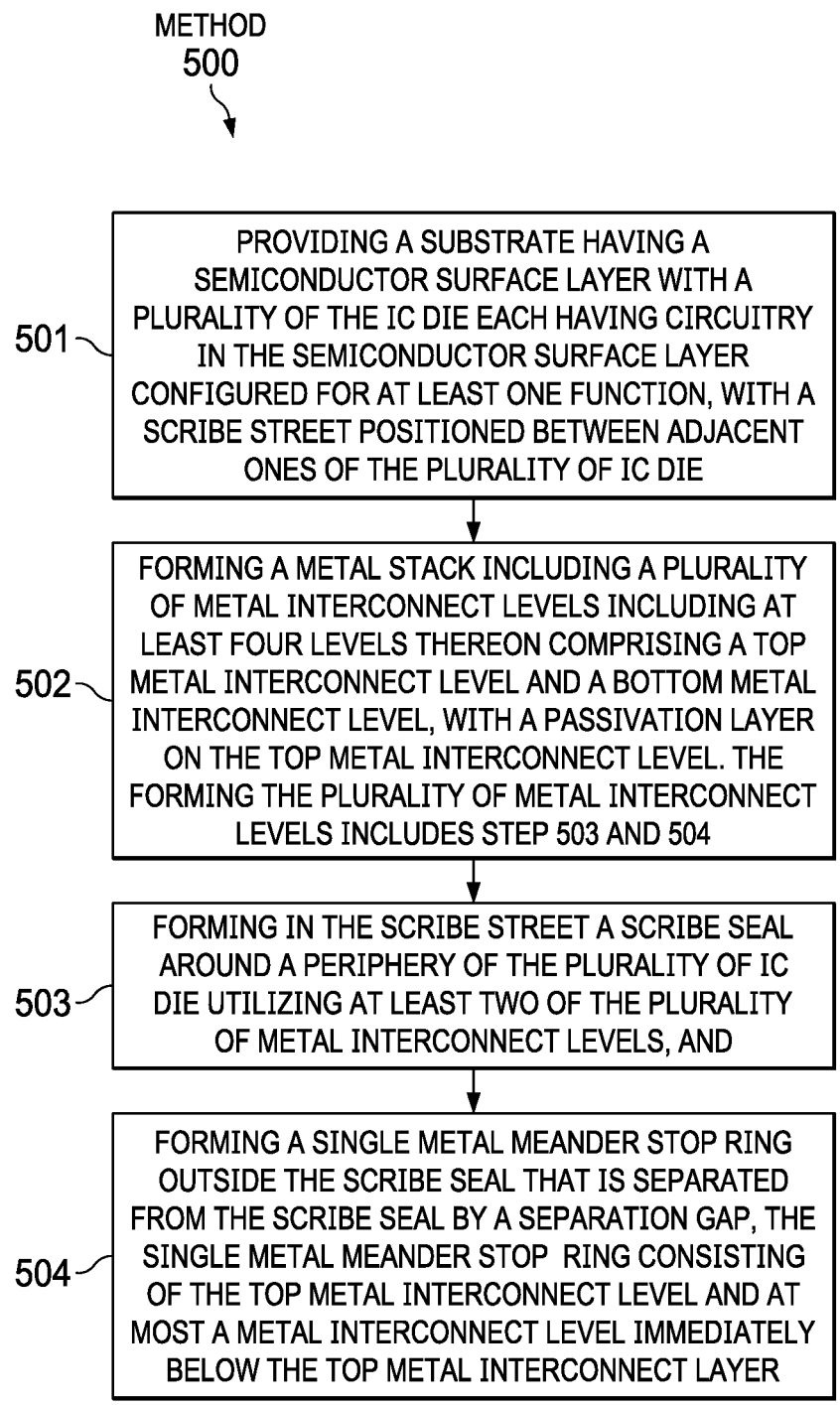
FIG. 5 is a flow chart that shows steps in an example method for fabricating IC die having only a single metal meander stop ring, where the metal meander stop consists of only the top metal interconnect level, or only the top metal interconnect level and the metal interconnect level immediately below the top metal interconnect level.

FIG. 5 is a flow chart that shows steps in an example method 500 for fabricating IC die having only a single metal meander stop ring, where the metal meander stop consists of only the top metal interconnect level, or only the top metal interconnect level and the metal interconnect level immediately below the top metal interconnect level. Step 501 comprises providing a substrate having a semiconductor surface layer with a plurality of the IC die each having circuitry in the semiconductor surface layer configured for at least one function, with a scribe street positioned between adjacent ones of the plurality of IC die. Step 502 comprises forming a metal stack including a plurality of metal interconnect levels including at least four levels thereon comprising a top metal interconnect level and a bottom metal interconnect level, with a passivation layer on the top metal interconnect level. The forming the plurality of metal interconnect levels includes step 503 comprising forming in the scribe street a scribe seal around a periphery of the plurality of IC die utilizing at least two of the plurality of metal interconnect levels, and step 504 comprising forming a single metal meander stop ring outside the scribe seal that is separated from the scribe seal by a separation gap, wherein the single metal meander stop ring consists of the top metal interconnect level and at most a metal interconnect level immediately below the top metal interconnect layer.

The single metal meander stop ring can consist of only the top metal interconnect level. The method 500 can further comprise stealth laser dicing focused depthwise in the scribe street of the substrate to generate embedded crystal damage in the scribe street. The single meander stop ring can be a continuous encircling ring that encircles the IC die.

Disclosed aspects can be integrated into a variety of assembly flows to form a variety of different packaged semiconductor devices and related products. The assembly can comprise single semiconductor die or multiple semiconductor die, such as configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An integrated circuit (IC) die, comprising:
  a substrate having a semiconductor surface layer with circuitry configured for at least one function including a plurality of metal interconnect levels thereon comprising a top metal interconnect level and a bottom metal interconnect level, with a passivation layer comprising a dielectric material on the top metal interconnect level;
  a scribe street around a periphery of the IC die, the scribe street comprising:
    a scribe seal utilizing at least two of the plurality of metal interconnect levels;
    an inner metal meander stop ring comprising at least the top metal interconnect level located outside the scribe seal, wherein the scribe seal and the inner metal meander stop ring are separated by a first separation gap, and
    an outer metal meander stop ring comprising at least the top metal interconnect level located outside the inner metal stop ring, wherein the outer stop ring and the inner stop ring are separated by a second separation gap.

2. The IC die of claim 1, wherein the inner metal meander stop ring and the outer metal meander stop ring are both continuous encircling rings.

3. The IC die of claim 1, wherein the inner metal meander stop ring and the outer metal meander stop ring are both non-continuous rings, wherein the inner metal meander stop ring has a first plurality of segments and the outer metal meander stop ring has a second plurality of segments, wherein the first plurality of segments are positioned over gaps between the second plurality of segments, and wherein the second plurality of segments are positioned over gaps between the first plurality of segments.

4. The IC die of claim 1, wherein the inner metal meander stop ring and the outer metal meander stop ring further comprise at least one of the plurality of metal interconnect levels besides the top metal interconnect level.

5. The IC die of claim 1, wherein the inner metal meander stop ring and the outer metal stop rings are both 1 µm to 3 µm wide.

6. The IC die of claim 1, wherein the inner metal meander stop ring and the outer metal stop rings are substantially parallel to one another and are exclusively along the periphery of the IC die.

7. An integrated circuit (IC) die, comprising:
  a substrate having a semiconductor surface layer with circuitry configured for at least one function including a plurality of metal interconnect levels thereon including at least four metal interconnect levels comprising a top metal interconnect level and a bottom metal interconnect level, with a passivation layer comprising a dielectric material on the top metal interconnect level;
  a scribe street around a periphery of the IC die, the scribe street comprising:
    a scribe seal utilizing at least two of the plurality of metal interconnect levels, and
    a single metal meander stop ring located outside the scribe seal consisting of the top metal interconnect level and at most a metal interconnect level immediately below the top metal interconnect layer, wherein the scribe seal and the single metal meander stop ring are separated by a separation gap.

8. The IC die of claim 7, wherein the single metal meander stop ring consists of only the top metal interconnect level.

9. The IC die of claim 7, wherein the single metal meander stop ring comprises a continuous encircling ring.

10. A method of fabricating integrated circuit (IC) die, comprising:
  providing a substrate having a semiconductor surface layer with a plurality of the IC die each having circuitry in the semiconductor surface layer configured for at least one function, with a scribe street positioned between adjacent ones of the plurality of IC die;
  forming a metal stack including a plurality of metal interconnect levels thereon comprising a top metal interconnect level and a bottom metal interconnect level, with a passivation layer on the top metal interconnect level, the forming the plurality of metal interconnect levels including:
    forming in the scribe street a scribe seal around a periphery of the plurality of IC die utilizing at least two of the plurality of metal interconnect levels,
    forming an inner metal meander stop ring utilizing the top metal interconnect level and an outer metal meander stop ring outside the scribe seal,
    wherein the inner metal meander stop ring is separated from the scribe seal by a first separation gap, and
    wherein the outer metal meander stop ring is separated from the inner metal meander stop ring by a second separation gap.

11. The method of claim 10, further comprising etching the passivation layer in a portion of the scribe street between adjacent ones of the outer metal meander stop rings to provide a trench in the passivation layer.

12. The method of claim 10, further comprising stealth laser dicing focused depthwise in the scribe street to generate embedded crystal damage in the scribe street.

13. The method of claim 10, wherein the inner metal meander stop ring and the outer metal stop rings are both 1 µm to 3 µm wide.

14. The method of claim 10, wherein the inner metal meander stop ring and the outer metal meander stop ring are both non-continuous rings, wherein the inner metal meander stop ring has a first plurality of segments and the outer metal meander stop ring has a second plurality of segments, wherein the first plurality of segments are positioned over gaps between the second plurality of segments, and wherein the second plurality of segments are positioned over gaps between the first plurality of segments.

15. A method of fabricating integrated circuit (IC) die, comprising:
  providing a substrate having a semiconductor surface layer with a plurality of the IC die each having circuitry in the semiconductor surface layer configured for at least one function, with a scribe street positioned between adjacent ones of the plurality of IC die;

forming a metal stack including a plurality of metal interconnect levels including at least four levels thereon comprising a top metal interconnect level and a bottom metal interconnect level, with a passivation layer on the top metal interconnect level, the forming the plurality of metal interconnect levels including:
- forming in the scribe street a scribe seal around a periphery of the plurality of IC die utilizing at least two of the plurality of metal interconnect levels, and
- forming a single metal meander stop ring outside the scribe seal that is separated from the scribe seal by a separation gap, the single metal meander stop ring consisting of the top metal interconnect level and at most a metal interconnect level immediately below the top metal interconnect layer.

16. The method of claim 15, wherein the single metal meander stop ring consists of only the top metal interconnect level.

17. The method of claim 15, further comprising stealth laser dicing focused depthwise in the scribe street of the substrate to generate embedded crystal damage in the scribe street.

18. The method of claim 15, wherein the single metal meander stop ring is 1 µm to 3 µm wide.

19. The method of claim 15, wherein the single meander stop ring is a continuous encircling ring that encircles the IC die.

* * * * *